United States Patent [19]
Weber

[11] 4,318,152
[45] Mar. 2, 1982

[54] DIGITAL HIGH VOLTAGE MONITOR AND DISPLAY FOR ELECTROSTATIC PRECIPITATORS

[75] Inventor: William G. Weber, West Chester, Ohio

[73] Assignee: United Air Specialists, Inc., Cincinnati, Ohio

[21] Appl. No.: 82,124

[22] Filed: Oct. 5, 1979

[51] Int. Cl.³ .......................... B03C 3/68; H02H 3/24
[52] U.S. Cl. ....................................... 361/92; 55/104; 55/105; 324/99 D; 324/133; 340/753; 340/762; 361/235
[58] Field of Search .......................... 361/90, 92, 235; 55/104, 105, 139; 340/660, 661, 663, 641, 642, 662, 753, 754, 782, 762, 511; 324/99 D, 98, 96, 133; 307/360, 361

[56] References Cited

U.S. PATENT DOCUMENTS

| | | | |
|---|---|---|---|
| 3,641,740 | 2/1972 | Schumann et al. | 55/139 X |
| 3,772,853 | 11/1973 | Burge et al. | 55/139 X |
| 3,893,828 | 7/1975 | Archer | 55/104 |
| 3,927,571 | 12/1975 | Athey | 324/99 D X |
| 3,987,392 | 10/1976 | Kugelmann et al. | 324/96 |

OTHER PUBLICATIONS

"Guard Your Battery with PM's Charge Checker"-Weinstein et al., Popular Mechanics, vol. 151, No. 5, 5/79.

Primary Examiner—Harry E. Moose, Jr.
Attorney, Agent, or Firm—Frost & Jacobs

[57] ABSTRACT

A high voltage monitor and display for electrostatic precipitators producing a digital output code representing the magnitude of the high voltage associated with the ionizer and collecting cells which is applied to a series of display elements arranged in a spaced linear relationship such that the number of adjacent display elements illuminated corresponds to the magnitude of the high voltage to provide a visible indication of ionizer cell and collector cell performance. A predetermined minimum cell voltage is established digitally, and the high voltage power supply inhibited when the high voltage falls below the predetermined value. Alarm means are also provided for indicating when the collector cell or ionizer cell voltage is below the predetermined operating minimum.

19 Claims, 2 Drawing Figures

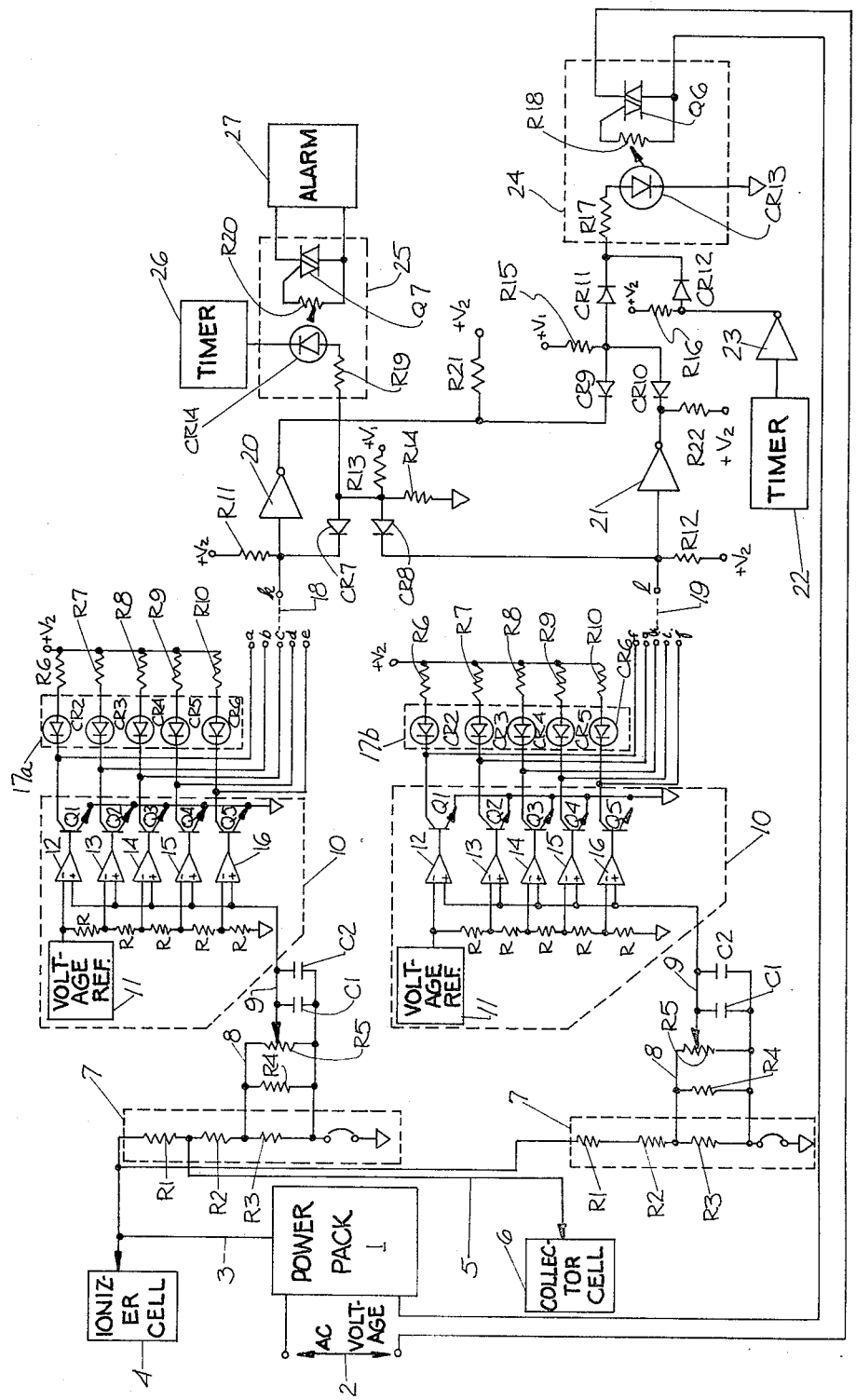

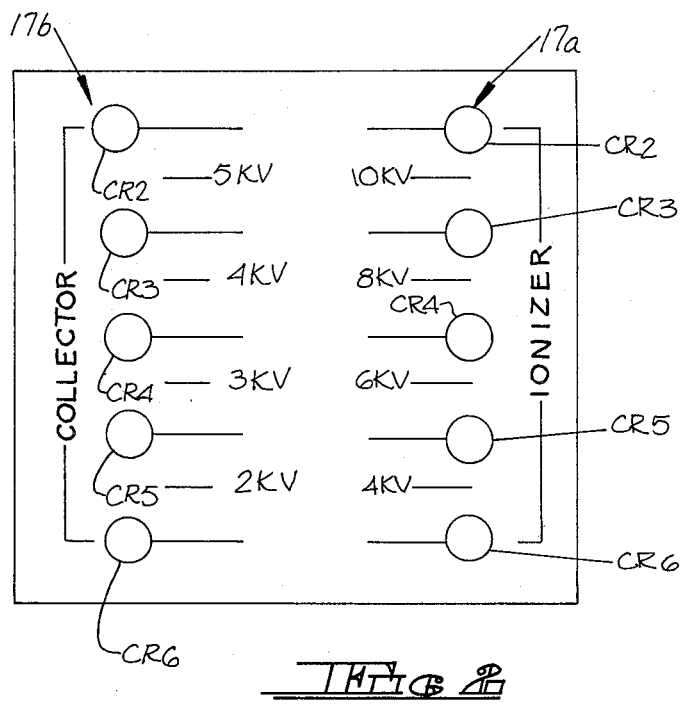

DIGITAL HIGH VOLTAGE MONITOR AND DISPLAY FOR ELECTROSTATIC PRECIPITATORS

SUMMARY OF THE INVENTION

The construction and operation of two stage electrostatic precipitator air cleaners is well understood and widely employed in residential, industrial and commercial applications where airborne particles must be removed to promote more healthful conditions. Fundamentally, an electrostatic precipitator comprises an ionizing cell containing a plurality of spaced ionizer electrodes, often thin wires or the like, which are charged to a relatively high DC voltage, usually in the neighborhood of 11-12 KV, which operate to create an electrostatic field for charging airborne particles as they are drawn through the ionizer cell by a fan or the like. Positioned downstream from the ionizer cell is a collecting cell made up of a number of parallel spaced grounded collecting plates which are interleaved with a plurality of parallel spaced collecting plates charged to a relatively high DC voltage, usually in the neighborhood of 6.5 KV. Airborne particles charged by the ionizer cell pass between the collecting plates, and are repelled by the charged plates toward the grounded plates to which the particles adhere. The air exhausted from the electrostatic precipitator is consequently almost entirely free of airborne particles. Periodically, the ground plates must be cleaned to remove the collected particles by rapping, washing or the like.

It has been found that if the collected particulate material is not removed on a regular basis, the collection efficiency of the electrostatic precipitator is greatly reduced. Furthermore, as the particulate material builds up on the collecting plates, arcing may occur resulting in increased collector plate current. The increased current coupled with arcing or sparkover may ignite the particulate material, resulting in a possible fire hazard. This condition may also occur when the collected particulate material bridges the region between a grounded and charged collecting plate causing a sustained short. These problems may also exist in the ionizer cell in the region between the ionizer electrode and the adjacent ionizer passive electrode. Generally, under such conditions of arcing or sustained short circuits, the ionizer or collecting cell current increases significantly to cause a decrease in the high voltage supplied to the cell.

The present invention comprises means for monitoring the magnitude of the high voltage associated with the ionizer or collecting cells, or both, and inhibits the high voltage output when the high voltage drops below a predetermined value. In addition, the present invention may provide an alarm output for notifying maintenance personnel that appropriate remedial measures must be undertaken.

Fundamentally, the present invention includes means for converting the magnitude of the high voltage to a digital output code containing a plurality of binary bits representing the magnitude of the high voltage associated with the ionizer and collecting cells. The high voltage is reduced to a relatively low voltage by means of a resistor divider string or "end block." The low voltage is compared in a plurality of voltage comparators with discrete reference voltage values, with the outputs of the comparators forming the digital output code. This digital output code is applied to a series of display elements arranged in spaced linear relationship such that the number of adjacent display elements illuminated corresponds to the magnitude of the high voltage. A separate display is provided for the collector and ionizer, and is calibrated in kilovolts to provide the user with an accurate and readily visible indication of ionizer cell and collector cell performance.

The present invention also includes means associated with both the ionizer and collecting cells for establishing a predetermined minimum cell voltage, and inhibiting the high voltage power supply when the high voltage falls below this value. In particular, the high voltage output is inhibited when a selected one of the binary bits forming the digital output code changes state.

The present invention also includes alarm means for providing an alarm signal, either visual or audible, when the collector cell or ionizer cell high voltage falls below the preselected value. Finally, the present invention includes automatic resetting means for returning the high voltage to an operable condition after an elapsed period of time.

Other features of the invention will become apparent from the detailed description which follows:

BRIEF DESCRIPTION OF THE DRAWING

FIG. 1 is a schematic diagram of the digital high voltage monitor and display of the present invention.

FIG. 2 is a diagrammatic view of the collecting cell and ionizer cell monitor display of the present invention.

DETAILED DESCRIPTION

A preferred embodiment of the digital high voltage monitor and display for electrostatic precipitators is illustrated in the general schematic diagram of FIG. 1. As is well known in the art, an electrostatic precipitator air cleaner includes a power pack power supply 1 which converts standard alternating current 2 to the high voltage DC potential 3 necessary for charging the ionizer electrodes of ionizer cell 4, and the high voltage DC potential 5 for charging the charged collector plates of collector cell 6. In general, high voltage ionizer potential 3 will be of the order of 11-12 KV, while high voltage collector cell potential 5 will be of the order of 6.5 KV. As is well understood in the art, the ionizer and collecting cell potentials may be derived independently, or produced by resistor division or the like.

An end block 7 comprising a resistor divider formed by resistors R1, R2 and R3 reduces the ionizer cell voltage 3 to a relatively low control voltage 8 of approximately 300 volts. This level is further reduced by fixed resistor R4 and potentiometer R5 to a signal level of approximately 1 volt on line 9. A capacitor C1 operates in association with resistors R4 and R5 to provide an integrating or delay affect of approximately two seconds to insure immunity to high voltage arc and spiking. A second capacitor C2, of a smaller value than capacitor C1, is used to filter high frequency spiking.

A similar arrangement is utilized for reducing and filtering the collector cell voltage, with elements having like functions being given like designations.

The control voltage appearing on line 9 is applied to conversion means 10, which converts the magnitude of the level on line 9 corresponding to the magnitude of the high voltage to a digital output code. The operation and construction of the conversion means 10 associated with the ionizer cell is identical with the construction and operation of the conversion means associated with the collecting cell.

Fundamentally, conversion means 10 comprises a voltage reference 11 producing a stable output of exactly one volt. The voltage reference output is applied to a resistor divider string comprising five series connected resistors, each having a value R ohms. With this arrangement, the voltage appearing at the top of the resistor divider string will be one volt, the voltage appearing at the junction of the first and second resistor will be 0.8 volts, etc., such that a plurality of discrete reference voltage values are produced having increments of 0.2 volts.

Each discrete reference voltage value is applied to the inverting input of a voltage comparator 12–16. The non-inverting input of each comparator is connected to control line 9. The output of the comparators 12–16 are connected to the base of open collector driver tansistors Q1–Q5, with the emitter of each transistor being connected to ground. Conversion means 10 may be implemented with discrete components, or may be constructed using an analog level detector manufactured under the designation TL489CP by Texas Instruments, Inc.

Each open collector output from driver transistors Q1–Q5 is connected to the corresponding cathode lead of a visibly sensible display element formed by light emitting diodes CR2–CR6, which together form ionizer cell voltage display means 17a and collecting cell display menas 17b, respectively. The anode of each light emitting diode CR2–CR6 is connected to positive supply voltage $+V_2$ through an appropriate current limiting resistor R6–R10.

It will be observed that when control voltage 9, which is proportional to ionizer cell voltage 3 or collecting cell voltage 5, is less than 0.2 volts, all of the outputs of comparators 12–16 will be at a ground potential, causing transistors Q1–Q5 to be turned off, and light emitting diodes CR2–CR6 to be extinguished. However, when control voltage 9 equals or exceeds 0.2 volts, the output of comparator 16 will become a high level, turning on transistor Q5 and permitting current to flow from supply $+V_2$ through light emitting diode CR6 to ground, thereby illuminating this display element. It will be further observed that the signals appearing on the output lines formed by the collectors of transistors Q1–Q5 from a digital code consisting of a plurality of binary bits. Under the conditions described hereinbefore when the control voltage 9 is less than 0.2 volts, the digital output code will be 11111. However, when the control voltage 9 equals or exceeds 0.2 volts, the digital output code will become 11110, with the output line formed by the collector of transistor Q5 forming the least significant bit.

In a like manner, the output of comparator 15 will switch when control voltage 9 equals or exceeds 0.4 volts to turn on transistor Q4 and light emitting diode CR5. Under this condition, the digital output code will be 11100. Finally, when control signal 9 equals or exceeds 1.0 volts, representing a full scale value, all of the comparator outputs will be high such that all of the transistors will be turned on and all of the light emitting diodes illuminated, further resulting in a digital output code of 00000. It will be observed that this arrangement results in a digital output code representing the magnitude value of the high voltage.

In the preferred embodiment illustrated in FIG. 2, the individual display elements CR2–CR6 forming ionizer cell high voltage display 17a and collecting cell high voltage display 17b are arranged in spaced linear vertical relationship such that the number of adjacent display elements illuminated corresponds to the magnitude of the associated high voltage. For example, as illustrated in FIG. 2, collector cell voltage display 17b consists of a vertical array of light emitting diodes CR2–CR6, with the lowest voltage indicator CR6 located at the bottom of the display. A similar arrangement is utilized for ionizer cell voltage display 17a. Suitable calibrations are provided for the collector display to indicate the high voltage ranges associated with each display element CR2–CR6. The particular range chosen in the preferred embodiment covers the region 0–6 KV in 1 KV increments for the collector display, and 0–12 KV in 2 KV increments for the ionizer display. It will be understood that the particular range covered and the number of display elements making up that range may be varied as desired by proper choice of scaling resistors R1–R5.

In operation, when the ionizer cell voltage equals or exceeds 2 KV (corresponding to a control signal 9 value of 0.2 volts), light emitting diode CR6 will be illuminated. Correspondingly, when the ionizer cell voltage equals or exceeds 4 KV (corresponding to a control signal 9 value of 0.4 volts), light emitting diode CR5 of display 17a will be illuminated. Under normal conditions when the ionizer cell and collecting cell are operating at their normal operating high voltages, all of the display elements of display 17a and 17b will be illuminated. A decrease in either the ionizer cell or collecting cell high voltage will cause one or more of the display elements to become extinguished, indicating that the appropriate maintenance procedures should be initiated.

The present invention also includes means associated with both the ionizer and collecting cells for establishing a predetermined minimum cell voltage, and inhibiting the high voltage power supply when the high voltage falls below this value. It will be observed in FIG. 1 that each of the collector outputs from driver transistors Q1–Q5 terminates in a connection point a–j. Any one of these connection points in the group a–e associated with the ionizer cell conversion means may be connected to a corresponding connection point k by means of junction 18. In a similar manner, any of the connection points in the group f–j associated with the collecting cell conversion means may be connected to connection point 1 by means of junction 19.

Connection point k is connected to the cathode of steering diode CR7, through pull-up resistor R11 to supply voltage $+V_2$, and to the input of buffer amplifier 20. Similarly, connection point 1 is connected to the cathode of steering diode CR8, through pull-up resistor R12 to supply voltage $+V_2$, and to the input of buffer amplifier 21. The anodes of steering diodes CR7 and CR8 are connected through resistor R13 to supply voltage $+V_1$, and through resistor R14 to ground.

The output of buffer amplifier 20 is connected to the cathode of steering diode CR9 and pull-up resistor R21 and the output of buffer amplifier 21 is connected to the cathode of steering diode CR10 and pull-up resistor R22. The anodes of diodes CR9 and CR10 are connected through resistor R15 to supply voltage $+V_1$, and to the anode of diode CR11. An astable multivibrator or timer 22 supplies output pulses having a period of oscillation of approximately six seconds and a 33% duty cycle. These pulses are inverted by buffer amplifier 23 and applied to the anode of steering diode CR12. A pull-up resistor R16 may also be provided at the output of amplifier 23 as required. The cathode of steering diode CR12 is connected to the cathode of steering diode CR11, and to the input of optical isolator switch 24. Switch 24 includes a current limiting resistor R17, and a light emitting element CR13 connected to ground. Light emitting element CR13 is in optical communication with light sensitive resistance R18 which forms a trigger input to triac Q6. The outputs of triac Q6 forming the outputs of optical isolator switch 24 are connected in one line of the AC voltage supplying power pack 1.

In operation, one of connection points a–e is connected by means of junction 18 to connection point k to determine the magnitude value of the ionizer cell potential below which the time voltage outputs from power pack 1 is to be inhibited. For example, in the embodiment illustrated in FIG. 1, a connection has been made between connection points c and k, corresponding to an ionizer cell voltage from 7 to 9 KV. Under normal conditions, transistor Q3 will be turned on, resulting in a high level at the output of inverting buffer amplifier 20. This level reverse biases steering diode CR9, permitting current to flow through resistor R15 and diode CR11 to optical isolator switch 24 to turn triac Q6 on and permit input voltage 2 to power pack 1. However, in the event that the ionizer cell voltage falls below 7 KV due to particle accumulation or other reasons as described hereinabove, the binary bit of the output code associated with transistor Q3 will change state to a high level, resulting in a ground level at the output of inverting buffer amplifier 20, interrupting current flow to optical isolator switch 24 and inhibiting the high voltage outputs from power pack 1. Consequently, the high voltage outputs will be inhibited when the ionizer cell output is less than the predetermined value preset by junction 18. It will be observed that this connection may be changed as desired to produce a different threshold level.

Similar operation results from low collecting cell voltages. In this instance, junction 19 determines the collection cell high voltage value below which power pack 1 operation is to be inhibited. For example, in the embodiment illustrated, a connection has been made between connection point h and connection point 1 corresponding to a collecting cell voltage from 3.5 to 4.5 KV. In the event the cell voltage falls below this value, causing the collector of transistor Q3 to change state, the anode of steering diode CR11 will be pulled down to turn triac Q6 off and inhibit primary voltage to power pack 1. It will be observed that the connection formed by junction 19 may be changed to provide a different switching level. Furthermore, it will be observed that the connections associated with junction 18 and junction 19 may be different as required in particular applications.

As described hereinabove, timer 22 continuously produces output pulses having approximatley a six second period and a duty cycle of 33%. That is, the pulses appearing at the output of inverting buffer amplifier 23 are low for approximately four seconds and high for approximately two seconds. Under normal operating conditions where current is flowing to the input of optical isolator switch 24, timer 22 has no affect on the operation of the monitor of the present invention. However, when the circuit is in the inhibit mode due to either or both of the ionizer cell or collector cell voltages being below a predetermined minimum, a high level at the output of buffer amplifier 23 will cause optical isolator switch 24 to turn on and supply primary current to power pack 1 for approximately two seconds out of every six seconds. Consequently, during the periods when the power pack is not inhibited, the sensing circuitry may determine if the sparking or short circuit condition has been cleared and return the system to normal operation. The fact that the high voltages are pulsed in this manner prevents heat build up in the ionizer or collecting cell which could result in a potential fire hazard.

The present invention also includes alarm means for providing an alarm signal, either visual or audible, when the collector cell and ionizer cell high voltage falls below the aforementioned preselected value. As illustrated in FIG. 1, the anodes of steering diodes CR7 and CR8 are connected to the input of optical isolator switch 25 formed by current limiting resistor R19 connected to the anode of light emitting element CR14. The cathode of light emitting element CR14 is connected to the output of astable multivibrator or timer 26 which continuously produces output pulses having an approximately six second period and a 33% duty cycle. Light emitting element CR14 is optically coupled to light sensitive resistor R20 which forms a trigger input to triac Q7 for activating audible or visible alarm 27.

In operation, when the ionizer cell and collecting cell voltages are above the predetermined minimum as described hereinabove, the cathodes of steering diodes CR7 and CR8 will be at ground, preventing current flow into optical isolator switch 25. However, in the event that either the ionizer or collecting cell voltages falls below the predetermined minimun, the corresponding steering diode CR7 or CR8 will be reverse biased, permitting current to flow through resistor R13 to optical isolator switch 25. During the period when the output of timer 26 is at a ground level, current may be sinked by the timer, illuminating light emitting element CR14 and causing triac Q7 to become energized to activate alarm 27. When the output of timer 26 in high, alarm 27 will be turned off, resulting in pulsed operation of the alarm to direct attention to the low voltage condition in the electrostatic precipitator. Consequently, the shut down mechanism operates as follows. Timer 22 first turns the power pack on which permits the ionizer voltage and the collector cell voltage (which is derived from the ionizer voltage) to rise. A failure in either ionizer or collector cell voltages will shut the unit down. Both point K and point L must be at a high level to shut down or back bias CR7 and CR8 to allow timer 26 to activate alarm 27A as soon as triac switch 24 is opened.

It will also be observed that the integrating action of capacitors C1 and C2 in association with resistors R1-R5 insure that short duration perturbations in the cell voltage caused by rapidly occurring spikes will not result in inhibition of power pack 1 or activation of alarm 27. In this manner, the system described hereinabove will only react to decreases in cell or ionizer voltage which last longer than approximately two seconds as might be encountered with prolonged sparking or a sustained short circuit condition.

It will be understood that various changes in the details, materials, steps and arrangements of parts, which have been herein described and illustrated in order to explain the nature of the invention, may be made by those skilled in the art within the principal and scope of the invention as expressed in the appended claims.

The embodiments of the invention in which an exclusive property or privilege is claimed are as follows:

1. In an electrostatic precipitator of the type having an ionizer cell including a plurality of ionizer electrodes for charging airborne particles, a collector cell positioned downstream from said ionizer cell including a plurality of collector electrodes for collecting said charged particles, and power pack means producing a relatively high voltage output for charging said ionizer and collector electrodes, the improvement in combination therewith comprising means for monitoring the magnitude of said high voltage including means for converting the magnitude of said high voltage to a digitial output code representing said magnitude value, comparison means responsive to said digital output for providing an output signal when said high voltage magnitude is less than a predetermined value, and means responsive to said comparison means output for inhibiting said high voltage, wherein said high voltage inhibiting means periodically inhibits said high voltage.

2. The electrostatic precipitator according to claim 1 wherein said conversion means comprises voltage reference means producing a plurality of discrete reference voltage values and comparison means for comparing said high voltage output to each of said reference voltage values to produce said digital output.

3. The electrostatic precipitator according to claim 2 wherein said display means includes a visibly sensible display element associated with each of said reference voltage values.

4. The electrostatic precipitator according to claim 3 wherein said comparison means comprises a comparator associated with each of said reference voltage values and said display elements for illuminating a particular one of said display elements when said high voltage exceeds the associated reference voltage value.

5. The electrostatic precipitator according to claim 4 wherein said display elements are arranged in spaced linear relationship such that the number of adjacent display elements illuminated corresponds to said high voltage magnitude.

6. The electrostatic precipitator according to claim 5 wherein said reference voltage values are selected such that each of said display elements represents a range of high voltage values.

7. The electrostatic precipitator according to claim 1 wherein said monitoring means includes a separate monitoring means for the high voltage associated with said ionizer cell and said collector cell.

8. The electrostatic precipitator according to claim 1 wherein said conversion means comprises resistor divider means for reducing said high voltage to a relatively low voltage, voltage reference means producing a plurality of discrete reference voltage values, and a comparator for comparing each of said reference voltage values to said low voltage, the outputs of said comparators forming said digital output code.

9. The electrostatic precipitator according to claim 7 including comparison means responsive to said digitial output for providing an output signal when said high voltage magnitude is less than a predetermined value and means responsive to said comparison means output for inhibiting said high voltage.

10. The electrostatic precipitator according to claim 1 including means for testing when said high voltage again exceeds said predetermined value to reset said inhibiting means and restore said high voltage.

11. The electrostatic precipitator according to claim 1 wherein said high voltage inhibiting means periodically inhibits said high voltage.

12. The electrostatic precipitator according to claim 1 including alarm means responsive to said comparison means output for providing an alarm signal.

13. The electrostatic precipitator according to claim 1 including separate monitoring means for the high voltage associated with said ionizer cell and said collector cell, each of said separate monitoring means including comparison means responsive to the associated digital output for providing an output signal when the associated high voltage magnitude is less than a predetermined value, and means responsive to said comparison means output signals for inhibiting said high voltage when either or both of said ionizer cell or collector cell high voltage magnitudes is less than said predetermined value.

14. The electrostatic precipitator according to claim 12 including alarm means responsive to said comparison means output for providing an alarm signal when either of said ionizer cell or collector cell high voltage magnitude is less than said predetermined value.

15. The electrostatic precipitator according to claim 1 including presettable means for establishing said predetermined value, said presettable means including means for changing said predetermined value.

16. The electrostatic precipitator according to claim 14 including separate monitoring means for the high voltage associated with said ionizer cell and said collector cell, each of said separate monitoring means including comparison means responsive to the associated digital output for providing an output signal when the associated high voltage magnitude is less than a predetermined value, presettable means associated with each of said comparison means for establishing said predetermined value, said presettable means including means for changing said predetermined value, and means responsive to said comparision means output signals for inhibiting said high voltage when either or both of said ionizer cell or said collector cell high voltage magnitudes is less than said predetermined value.

17. The electrostatic precipitator according to claim 15 wherein the predetermined value associated with said ionizer cell and the predetermined value associated with said collector cell represent different high voltage magnitudes.

18. The electrostatic precipitator according to claim 1 wherein said digital output code comprises a plurality of binary bits, said comparison means operating to produce said output signal when a selected one of said binary bits changes state.

19. The electrostatic precipitator according to claim 1 including means for automatically resetting said inhibiting means to restore said high voltage after a predetermined period of time has elapsed.

* * * * *